United States Patent
Kai

(10) Patent No.: US 10,157,760 B2
(45) Date of Patent: Dec. 18, 2018

(54) SEMICONDUCTOR MANUFACTURING APPARATUS HAVING A PICKUP UNIT SIMULTANEOUSLY PICKING UP A PLURALITY OF SEMICONDUCTOR CHIPS

(71) Applicant: J-DEVICES CORPORATION, Usuki, Oita (JP)

(72) Inventor: Minoru Kai, Nomi (JP)

(73) Assignee: J-DEVICES CORPORATION, Usuki, Oita (JP)

( * ) Notice: Subject to any disclaimer, the term of this patent is extended or adjusted under 35 U.S.C. 154(b) by 0 days.

(21) Appl. No.: 15/600,082

(22) Filed: May 19, 2017

(65) Prior Publication Data

US 2017/0338136 A1 Nov. 23, 2017

(30) Foreign Application Priority Data

May 23, 2016 (JP) .................................. 2016-102481

(51) Int. Cl.
*H01L 21/68* (2006.01)
*H01L 21/67* (2006.01)
(Continued)

(52) U.S. Cl.
CPC .. *H01L 21/67132* (2013.01); *H01L 21/67144* (2013.01); *H01L 21/681* (2013.01); *H01L 21/6838* (2013.01); *H01L 23/147* (2013.01); *H01L 23/49833* (2013.01); *H01L 24/05* (2013.01); *H01L 24/75* (2013.01)

(58) Field of Classification Search
CPC ......... H01L 21/67132; H01L 21/67144; H01L 21/681; H01L 21/6838; H01L 23/147; H01L 23/49833; H01L 24/05; H01L 24/75
See application file for complete search history.

(56) References Cited

U.S. PATENT DOCUMENTS 6,202,292 B1 * 3/2001 Farnworth ............ B25B 11/005
269/21
8,224,062 B2 * 7/2012 Ohkura ............... G01N 21/9505
382/149

(Continued)

FOREIGN PATENT DOCUMENTS

JP 2006-203023 A 8/2006
JP 2015-170746 A 9/2015

*Primary Examiner* — Minh Trinh
(74) *Attorney, Agent, or Firm* — Hauptman Ham, LLP

(57) ABSTRACT

A semiconductor manufacturing apparatus comprises a stage connected to a vacuum generator to suction a semiconductor wafer including a plurality of semiconductor chips, a suction control unit connected to a connecting portion of the stage and the vacuum generator to control the connection of the stage and the vacuum generator, a pickup unit connected to a movement control unit simultaneously picking up the plurality of semiconductor chips, and a control unit controlling movement and rotation of the pickup unit and controlling the suction control unit, the control unit is connected to the movement control unit. The pickup unit converts an interval of the plurality of semiconductor chips to a predetermined pitch and holds the pitch. The pickup unit moves the plurality of semiconductor chips from the stage to mounting positions of a supporting substrate and simultaneously adheres the plurality of semiconductor chips at the mounting positions by the control unit.

7 Claims, 9 Drawing Sheets

(51) Int. Cl.
    *H01L 23/14*         (2006.01)
    *H01L 23/498*      (2006.01)
    *H01L 23/00*        (2006.01)
    *H01L 21/683*      (2006.01)

(56) References Cited

U.S. PATENT DOCUMENTS

| | | | |
|---|---|---|---|
| 2004/0091342 A1* | 5/2004 | Yajima | H01L 21/67132 |
| | | | 414/416.01 |
| 2006/0166466 A1 | 7/2006 | Maki et al. | |
| 2015/0255421 A1 | 9/2015 | Hirose | |
| 2016/0155656 A1* | 6/2016 | Matsumura | H01L 21/78 |
| | | | 438/464 |
| 2017/0133249 A1* | 5/2017 | Kim | B28D 5/0082 |
| 2017/0338136 A1* | 11/2017 | Kai | H01L 21/67132 |
| 2018/0158734 A1* | 6/2018 | Grivna | H01L 21/78 |

* cited by examiner

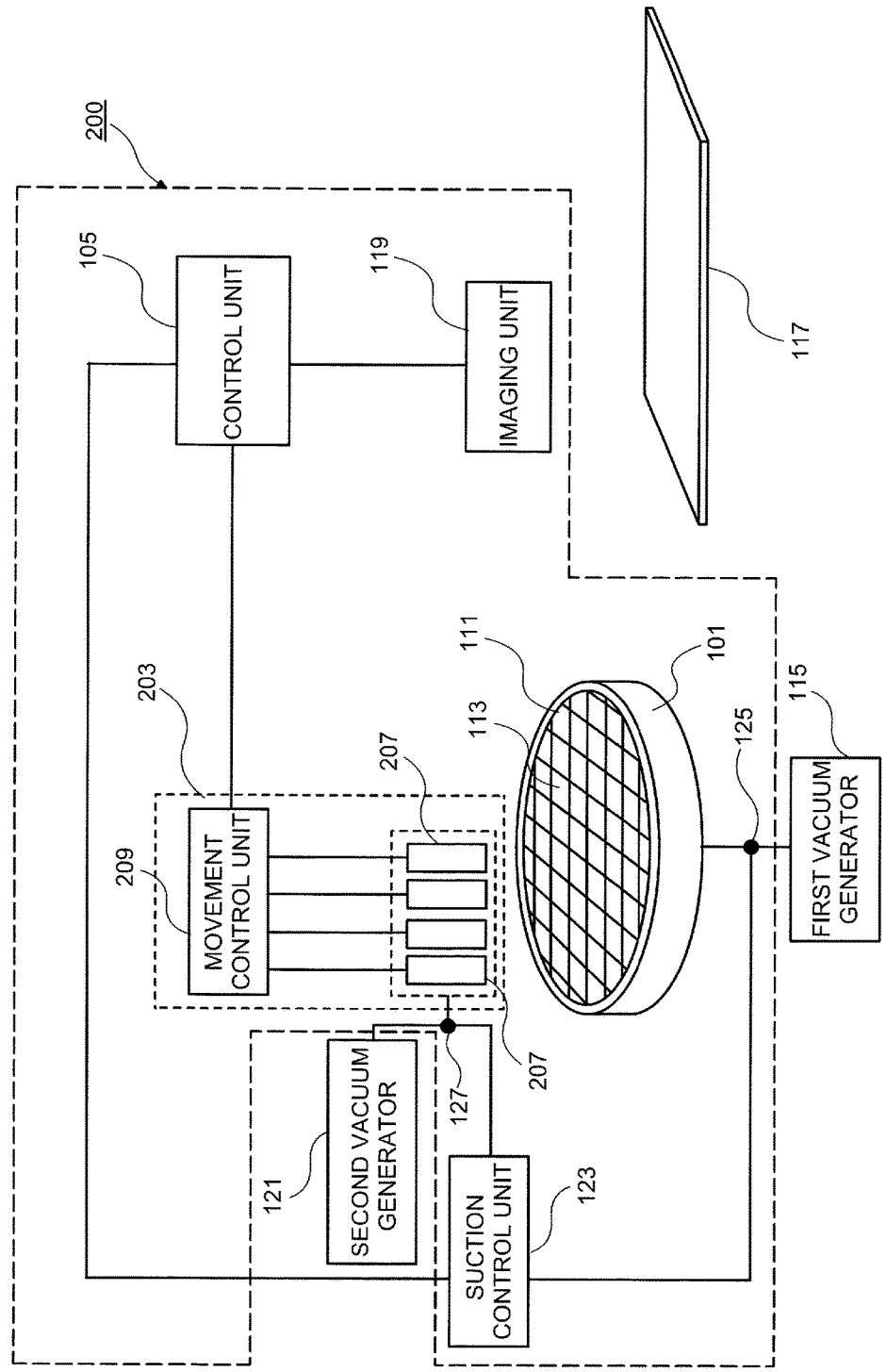

SEMICONDUCTOR MANUFACTURING APPARATUS HAVING A PICKUP UNIT SIMULTANEOUSLY PICKING UP A PLURALITY OF SEMICONDUCTOR CHIPS

CROSS REFERENCE TO RELATED APPLICATIONS

This application is based on and claims the benefit of priority from the prior Japanese Patent Application No. 2016-102481, filed on May 23, 2016, the entire contents of which are incorporate herein by reference.

FIELD

The present invention relates to semiconductor manufacturing apparatuses and manufacturing methods, and in particular, to a semiconductor manufacturing apparatus and a manufacturing method for realizing a high speed die attach.

BACKGROUND

A die attach device takes out a semiconductor device from a diced wafer, and mounts the same on a body to be mounted such as a lead frame, a substrate, and the like. Generally, the die attach device separately takes out a diced semiconductor device, aligns the diced semiconductor device with respect to the body to be mounted, and performs die attachment of the semiconductor device onto a surface of the body to be mounted. Such die attach device is disclosed in, for example, Japanese Patent Publication Laid-open No. 2006-203023 and Japanese Patent Publication Laid-open No. 2015-170746. Such die attach device has a problem in that the step of die attach takes time as the semiconductor device arranged on an adhesive layer or an adhesive sheet is separately taken out and adhered to the surface of the body to be mounted. In particular, the time to strip the semiconductor device from the adhesive layer or the adhesive sheet becomes longer the thinner the thickness of the semiconductor device, thus inhibiting reduction in time for the step of die attach.

SUMMARY

A semiconductor manufacturing apparatus according to one embodiment of the present invention includes a stage connected to a vacuum generator to suction a semiconductor wafer including a plurality of semiconductor chips; a suction control unit connected to a connecting portion of the stage and the vacuum generator to control the connection of the stage and the vacuum generator; a pickup unit picking up each of the plurality of semiconductor chips; and a control unit controlling movement and rotation of the pickup unit and controlling the suction control unit, wherein the pickup unit moves the semiconductor chip from the stage to a mounting position of a supporting substrate and adheres the semiconductor chip by the control unit.

The pickup unit may include a nozzle holding the semiconductor chip; and the control unit may control movement and rotation of the nozzle.

The semiconductor chip may include a marker provided in an optically readable manner on a surface. The semiconductor manufacturing apparatus may further include an imaging unit that images the marker. The control unit may recognize a position of the marker based on an image of the marker imaged by the imaging unit, and control the movement and the rotation of the nozzle.

The semiconductor manufacturing apparatus may further include an imaging unit that images a region including an end of the semiconductor chip. The control unit may recognize a position of a corner of the semiconductor chip based on an image including the end of the semiconductor chip imaged by the imaging unit, and control the movement and the rotation of the nozzle.

The imaging unit may image the region including the end of the semiconductor chip from an upper surface side or a back surface side of the semiconductor chip.

The control unit may binarize the image of the region including the end of the semiconductor chip to recognize the position of the corner of the semiconductor chip.

The semiconductor manufacturing apparatus may further include a stripping unit that strips a protective film attached to a surface on an opposite side of the surface facing the stage of the semiconductor wafer.

A semiconductor manufacturing apparatus according to one embodiment of the present invention includes a stage connected to a vacuum generator to suction a semiconductor wafer including a plurality of semiconductor chips; a suction control unit connected to a connecting portion of the stage and the vacuum generator to control the connection of the stage and the vacuum generator; a pickup unit simultaneously picking up the plurality of semiconductor chips; and a control unit controlling movement and rotation of the pickup unit and controlling the suction control unit, wherein the pickup unit converts an interval of the plurality of semiconductor chips to a predetermined pitch and holds the pitch, moves the plurality of semiconductor chips from the stage to mounting positions of a supporting substrate and simultaneously adheres the plurality of semiconductor chips at the mounting positions by the control unit.

The pickup unit may include a plurality of nozzles holding the plurality of semiconductor chips, respectively; and the control unit may control movement and rotation of each of the plurality of nozzles.

Each of the plurality of semiconductor chips may include a marker provided in an optically readable manner on a surface. The semiconductor manufacturing apparatus may further include an imaging unit that images the marker. The control unit may recognize a position of the marker based on an image of the marker imaged by the imaging unit and controls the movement and the rotation of the plurality of nozzles.

The semiconductor manufacturing apparatus may further include an imaging unit that images a region including an end of the semiconductor chip. The control unit may recognize a position of a corner of the semiconductor chip based on an image of the region including the end of the semiconductor chip imaged by the imaging unit, and control the movement and the rotation of the plurality of nozzles.

The imaging unit may image the region including the end of the semiconductor chip from an upper surface side or a back surface side of the semiconductor chip.

The control unit may binarize the image of the region including the end of the semiconductor chip to recognize the position of the corner of the semiconductor chip.

The semiconductor manufacturing apparatus may further include a stripping unit that strips a protective film attached to a surface on an opposite side of the surface facing the stage of the semiconductor wafer.

A semiconductor manufacturing method according to one embodiment of the present invention includes: arranging a semiconductor wafer including a plurality of semiconductor chips on a stage connected to a vacuum generator; picking up each of the plurality of semiconductor chips; and moving each of the plurality of semiconductor chips to a mounting position of a supporting substrate and adhering the semiconductor chip.

The semiconductor manufacturing method may further include: attaching a protective film on a first surface of the semiconductor wafer; and grinding a second surface on a side opposite the first surface to individualize the plurality of semiconductor chips before arranging the semiconductor wafer on the stage.

In the semiconductor manufacturing method, arranging the semiconductor wafer on the stage may include arranging the semiconductor wafer on the stage with the second surface of the semiconductor wafer facing the stage; and the method may further include stripping the protective film from the first surface of the semiconductor wafer after arranging the semiconductor wafer on the stage and before picking up the plurality of semiconductor chips.

A semiconductor manufacturing method according to one embodiment of the present invention includes: arranging a semiconductor wafer including a plurality of semiconductor chips on a stage connected to a vacuum generator; simultaneously picking up the plurality of semiconductor chips; converting respective interval of the plurality of semiconductor chips to a predetermined pitch; moving the plurality of semiconductor chips to mounting positions of a supporting substrate; and simultaneously adhering the plurality of semiconductor chips at the mounting positions.

The semiconductor manufacturing method may further include: attaching a protective film on a first surface of the semiconductor wafer; and grinding a second surface on a side opposite the first surface to individualize the plurality of semiconductor chips before arranging the semiconductor wafer on the stage.

In the semiconductor manufacturing method, arranging the semiconductor wafer on the stage may include arranging the semiconductor wafer on the stage with the second surface of the semiconductor wafer facing the stage, and the method may further include stripping the protective film from the first surface of the semiconductor wafer after suctioning the semiconductor wafer and before simultaneously picking up the plurality of semiconductor chips.

BRIEF DESCRIPTION OF DRAWINGS

FIG. 4 is a block diagram showing a semiconductor manufacturing apparatus according to a second embodiment of the present invention;

DESCRIPTION OF EMBODIMENTS

Figure 1:
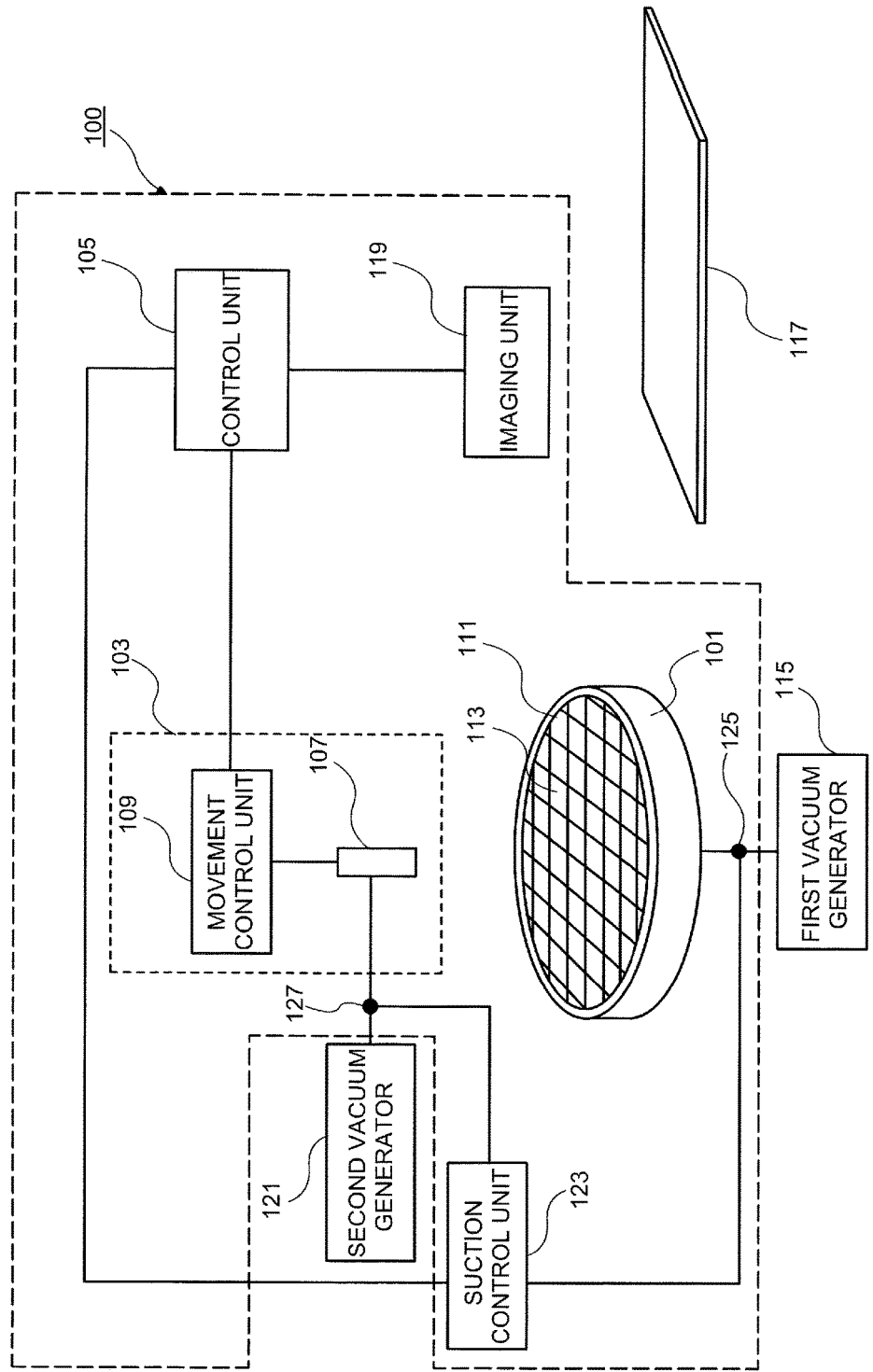
FIG. 1 is a block diagram showing a semiconductor manufacturing apparatus according to a first embodiment of the present invention.

Hereinafter, a semiconductor manufacturing apparatus according to the present invention will be described with reference to the drawings. The semiconductor manufacturing apparatus of the present invention can be implemented in a great number of different modes, and should not be interpreted as being limited to the content of the embodiment described below. In the figures referenced in the present embodiment, same reference numerals are denoted on the same portions or portions having similar functions, and repeated description will be omitted. In the following description, if an element such as a film, region, and the like is "above (on)" another element, this is not limited to a case of being "directly above (on)" the other element, and may also include a case in which another element is arranged therebetween.

It is an object of the present invention to provide a semiconductor manufacturing apparatus and a semiconductor manufacturing method capable of reducing the time for die attach while maintaining a semiconductor chip mounting precision with respect to an attaching surface of the body to be mounted.

First Embodiment

A semiconductor manufacturing apparatus and a semiconductor manufacturing method according to a first embodiment of the present invention will be described with reference to FIGS. 1 to 3.

FIG. 1 is a block diagram showing a semiconductor manufacturing apparatus 100 according to the first embodiment of the present invention. With reference to FIG. 1, the semiconductor manufacturing apparatus 100 includes a stage 101, a pickup unit 103, a control unit 105, and a suction control unit 123.

The stage 101 suctions and holds a semiconductor wafer 111. The semiconductor wafer 111 includes a plurality of individualized semiconductor chips 113. An optically readable first marker may be provided on a surface (upper surface or back surface) of each semiconductor chip 113. The semiconductor wafer 111 is individualized to the plurality of semiconductor chips 113 before being arranged on the stage 101, but is fixed with a protective film 201.

Before the semiconductor chip 113 is individualized, the protective film 201 is attached to a surface (first surface) of the semiconductor wafer 111 formed with elements grooves. After the protective film 201 is attached, the semiconductor wafer 111 is ground from a back surface (second surface) side on the side opposite to the surface (first surface) where the protective film 201 is attached until the grooves formed on the surface (first surface) side are exposed, thus individualizing the plurality of semiconductor chips 113. The plurality of individualized semiconductor chips 113 are fixed by the protective film 201.

Figure 2A:
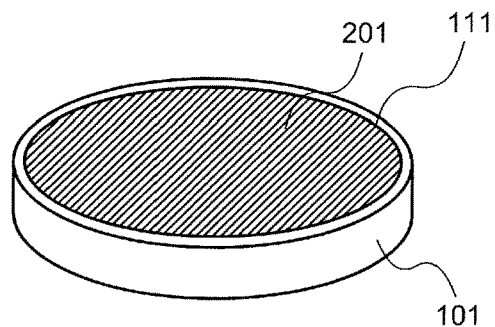
FIG. 2A is a view describing a step of stripping a protective film attached to a semiconductor wafer.
Figure 2B:
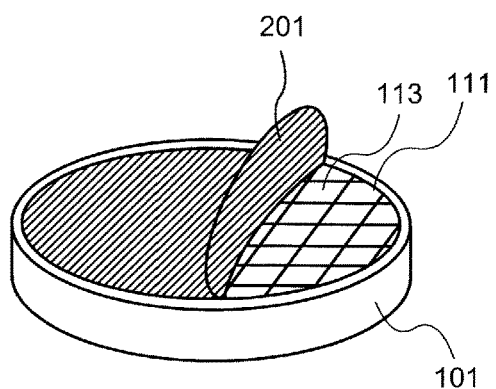
FIG. 2B is a view describing a step of stripping the protective film attached to the semiconductor wafer.
Figure 2C:
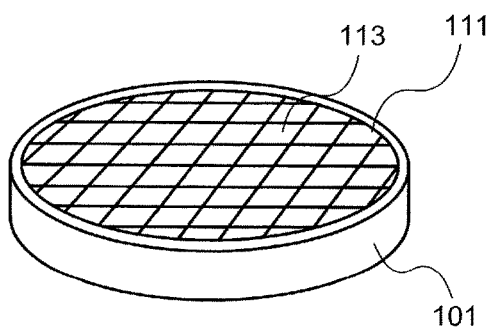
FIG. 2C is a view describing a step of stripping the protective film attached to the semiconductor wafer.
Figure 3:
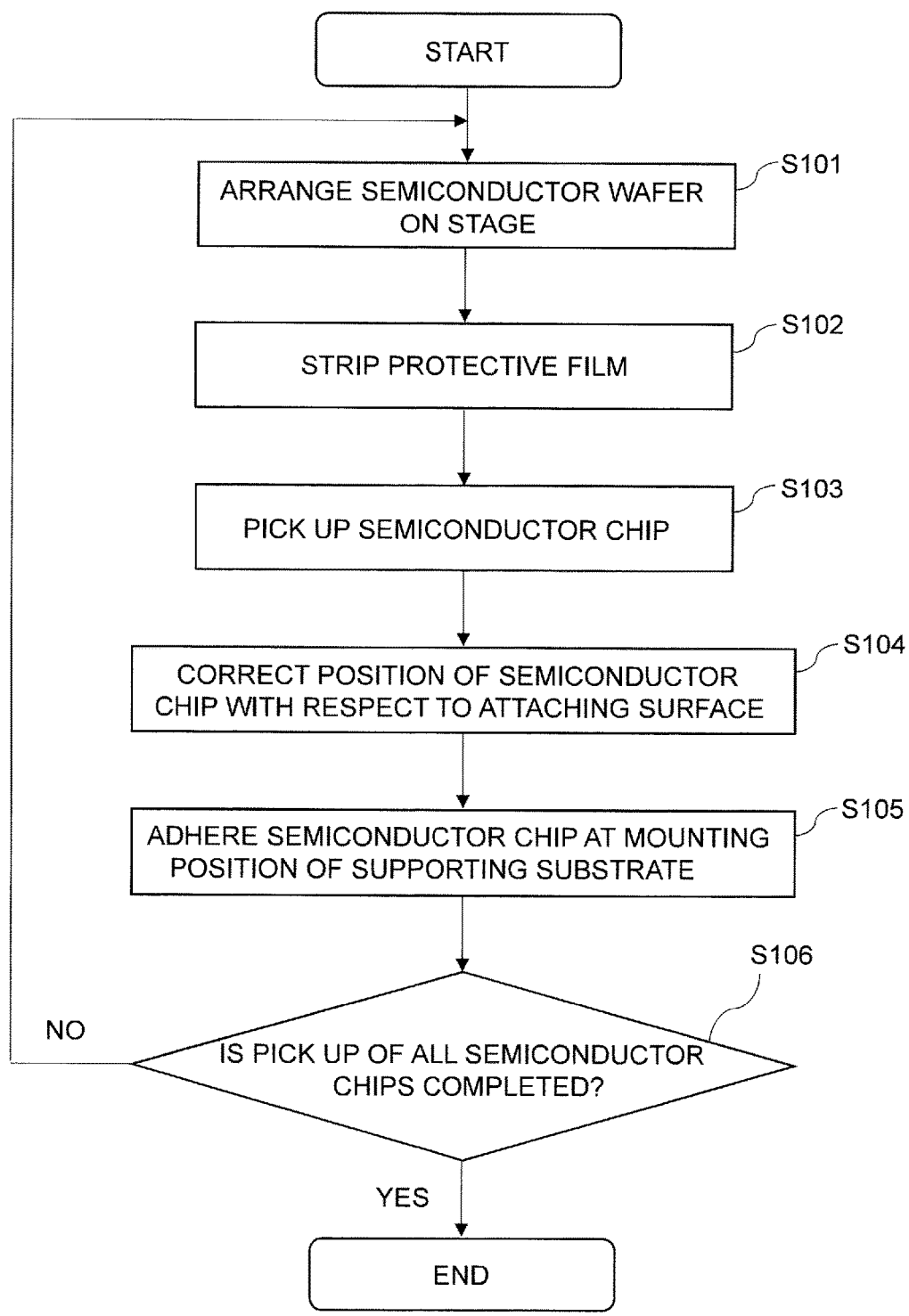
FIG. 3 is a flowchart describing a manufacturing method of a semiconductor device using the semiconductor manufacturing apparatus according to the first embodiment of the present invention.

As shown in FIG. 2A, the back surface (second surface) of the semiconductor wafer 111, on which the protective film 201 is not attached, is arranged facing the stage 101. The semiconductor wafer 111 arranged on the stage 101 is suctioned and fixed to the stage 101 with a first vacuum generator 115, to be described later. Thereafter, as shown in FIG. 2B, the protective film 201 is stripped from the surface (first surface) of the semiconductor wafer 111. The semiconductor manufacturing apparatus 100 may include a stripping unit (not shown) that strips the protective film attached to the surface of the semiconductor wafer 111. As shown in FIG. 2C, when the protective film 201 is stripped, the surface on which the element of the semiconductor chip 113 is formed is exposed. Hereinafter, the exposed surface of the semiconductor chip 113 is also referred to as an upper surface of the semiconductor chip 113, and the surface facing the stage 101 is also referred to as the back surface of the semiconductor chip 113.

The stage 101 is connected to the first vacuum generator 115 such as a vacuum pump via a first connecting portion 125. The first connecting portion 125 may, for example, be a valve, and the like for switching connection/disconnection of the stage 101 and the first vacuum generator 115. The stage 101 may include an opening communicating to the first connecting portion 125. The opening may be provided by a number corresponding to the number of semiconductor chips 113 included in the semiconductor wafer 111, or may be greater than or less than the number of semiconductor chips 113. The number of first connecting portion 125 may correspond to the number of openings arranged in the stage 101. Furthermore, the stage 101 may be formed from, for example, a porous material. When the stage 101 and the first vacuum generator 115 are connected by the first connecting portion 125 (when the connection is in the ON state), the stage 101 suctions and holds the semiconductor wafer 111 through the opening formed in the stage 101, or a plurality of holes formed in the stage 101. The connection of the stage 101 and the first vacuum generator 115 is controlled by the suction control unit 123.

The pickup unit 103 includes a nozzle 107 that picks up the semiconductor chip 113 from the semiconductor wafer 111 held on the stage 101, and a movement control unit 109 connected to the nozzle 107. The movement control unit 109 is connected to the control unit 105.

The movement control unit 109 is controlled by the control unit 105, and is moved based on a first control signal output from the control unit 105. The movement control unit 109 may rotate based on the first control signal. The movement control unit 109 also rotates and moves the nozzle 107 in XYZ axes directions (front and back direction, left and right direction, and up and down direction). The movement control unit 109 controls the movement and the rotation of the nozzle 107 in the XYZ axes directions based on a second control signal output from the control unit 105.

The nozzle 107 includes a hollow portion (not shown) connected to a second vacuum generator 121 via a second connecting portion 127. The second connecting portion 127 may, for example, be a valve, and the like for switching ON/OFF of the connection of the nozzle 107 and the second vacuum generator 121. When the second vacuum generator 121 and the nozzle 107 are connected via the second connecting portion 127 (when the connection is in the ON state), the nozzle 107 vacuum chucks and holds the semiconductor chip 113 through the hollow portion. The connection of the second vacuum generator 121 and the nozzle 107 is controlled by the suction control unit 123. A contacting portion of the nozzle 107 that makes contact with the semiconductor chip 113 may be formed with a low elasticity material. For example, the contacting portion of the nozzle 107 that makes contact with the semiconductor chip 113 is preferably made from a material having a rubber hardness of about 40 to 80, and may be made from NBR, fluorine containing rubber, and the like.

The control unit 105 controls the movement and the rotation of the pickup unit 103. In other words, the control unit 105 outputs the first control signal to the movement control unit 109 to control the movement or the rotation of the movement control unit 109. Furthermore, the control unit 105 outputs the second control signal to the movement control unit 109 to control the movement and the rotation of the nozzle 107 in the XYZ axes directions (front and back direction, left and right direction, and up and down direction) through the movement control unit 109. The control unit 105 moves the pickup unit 103 to above the semiconductor wafer 111 held on the stage 101, and controls the movement and the rotation of the nozzle 107 such that the nozzle 107 picks up and holds a predetermined semiconductor chip 113 through the movement control unit 109.

The control unit 105 may recognize the position of the stage 101 with an imaging unit (CCD camera, etc.) (not shown), align the pickup unit 103 to the position above the semiconductor chip wafer 111, and control the movement of the nozzle 107 so as to vacuum chuck and hold a predetermined semiconductor chip device 113 with the nozzle 107. Furthermore, the control unit 105 may take an image of the semiconductor wafer 111 with the imaging unit (CCD camera, etc.) (not shown), recognize the first marker provided on the semiconductor chip 113, align the pickup unit 103 to the position above the predetermined semiconductor chip 113, and control the movement of the nozzle 107 so as to vacuum chuck and hold the predetermined semiconductor chip device 113 with the nozzle 107. When the nozzle 107 suctions and holds the semiconductor chip 113, the control unit 105 moves the pickup unit 103 from above the semiconductor wafer stage 101 to above a supporting substrate 117.

The control unit 105 controls the suction control unit 123 that controls the first connecting portion 125 for connecting the first vacuum generator 115 and the stage 101, and the second connecting portion 127 for connecting the second vacuum generator 121 and the nozzle 107. The control unit 105 outputs a third control signal for controlling the suction control unit 123.

The suction control unit 123 is connected to the control unit 105, and receives the third control signal from the control unit 105. The suction control unit 123 controls the connection of the first vacuum generator 115 and the stage 101 through the first connecting portion 125, and controls the connection of the second vacuum generator 121 and the nozzle 107 through the second connecting portion 127 based on the third control signal. The third control signal may, for example, be a signal related to the position of the pickup unit 103, and the suction control unit 123 may control the connection of the first vacuum generator 115 and the stage 101 through the first connecting portion 125, and control the connection of the second vacuum generator 121 and the nozzle 107 through the second connecting portion 127 based on the position of the pickup unit 103.

For example, when the nozzle 107 picks up a predetermined semiconductor chip 113, the suction control unit 123 may set the second vacuum generator 121 and the nozzle 107 to the connected state (ON state) through the second connecting portion 127, and set the first vacuum generator 115 and the stage 101 to the disconnected state (OFF state) if the pickup unit 103 is located above the semiconductor wafer 111. Furthermore, for example, when the nozzle 107 picks up a predetermined semiconductor chip 113, the suction control unit 123 may set the second vacuum generator 121 and the nozzle 107 to the connected state (ON state) through the second connecting portion 127, and set the first vacuum generator 115 and the stage 101 to the disconnected state (OFF state) if the contacting portion of the nozzle 107 that makes contact with the semiconductor chip 113 is brought into contact with the predetermined semiconductor chip 113. Since the semiconductor wafer 111 is arranged on the stage 101 connected to the first vacuum generator 115, when the nozzle 107 picks up a predetermined semiconductor chip 113, the first vacuum generator 115 and the stage 101 are switched to the disconnected state (OFF state) so that the nozzle 107 can easily suction the predetermined semiconductor chip 113.

When a plurality of openings are provided in the stage 101 and the first connecting portion 125 corresponding to the number of openings is arranged, the suction control unit 123 may set the first vacuum generator 115 and the stage 101 to the disconnected state (OFF state) only in a region the predetermined semiconductor chip 113 to be picked up by the nozzle 107 of the pickup unit 103 is arranged when the suction control unit 123 sets the first vacuum generator 115 and the stage 101 to the disconnected state (OFF state). In other words, the suction control unit 123 may set the first vacuum generator 115 and the stage 101 to the disconnected state (OFF state) only in the region the predetermined semiconductor chip 113 is arranged by the first connecting portion 125 communicating to the opening located in the region the predetermined semiconductor chip 113 to be picked up by the nozzle 107 is arranged, and maintain the first vacuum generator 115 and the stage 101 in the connected state (ON state) through the first connecting portion 125 in a region excluding the region the predetermined semiconductor chip 113 is arranged. Furthermore, the suction control unit 123 may set the first vacuum generator 115 and the stage 101 to the disconnected state (OFF state) in an entire region the semiconductor wafer 111 is arranged.

When the pickup unit 103 is not located above the semiconductor wafer 111, the suction control unit 123 may set the first vacuum generator 115 and the stage 101 to the connected state (ON state) through the first connecting portion 125. Furthermore, when the contacting portion of the nozzle 107 that makes contact with the semiconductor chip 113 is not brought into contact with the predetermined semiconductor chip 113, the suction control unit 123 may set the first vacuum generator 115 and the stage 101 to the connected state (ON state) through the first connecting portion 125.

The supporting substrate 117 is a body to be mounted on which the semiconductor chip 113 is mounted. The supporting substrate 117 is not particularly limited, but may be a substrate having a mounting position on a surface to where the semiconductor chip 113 is mounted. However, the supporting substrate 117 is not limited thereto, and for example, may be a lead frame, and the like. A die attach film or an adhesive is arranged at the mounting position of the semiconductor chip 113 located on the surface of the supporting substrate 117.

The pickup unit 103 moves the semiconductor chip 113 from the stage 101 to the mounting position of the supporting substrate 117. The pickup unit 103 carries out position correction of the semiconductor substrate 113 with respect to an attaching surface of the supporting substrate 117 so that the semiconductor chip 113 is arranged at the mounting position of the attaching surface of the supporting substrate 117 based on the second control signal from the control unit 105 in the course of moving the semiconductor chip 113 from the stage 101 to the mounting position of the supporting substrate 117. In this case, the control unit 105 rotates and moves the nozzle 107 in the XYZ axes directions (front and back direction, left and right direction, and up and down direction) through the movement control unit 109 to carry out the position correction of the semiconductor chip 113.

After the position correction of the semiconductor chip 113 is carried out, the pickup unit 103 arranges and adheres the semiconductor chip 113 at the mounting position of the supporting substrate 117. In other words, the control unit 105 controls the movement control unit 109 to move the nozzle 107 holding the semiconductor chip 113, arranges the semiconductor chip 113 on the attaching surface, and then pressurizes and adheres the semiconductor chip 113 so that the semiconductor chip 113 is arranged at the mounting position of the attaching surface of the supporting substrate 117.

The semiconductor manufacturing apparatus 100 may include an arbitrary imaging unit 119. The imaging unit 119 is an optical equipment for imaging an image of a surface of the semiconductor chip 113, and for example, may be a CCD camera. If the first marker is provided on the surface of the semiconductor chip 113, the imaging unit 119 may image the surface of the semiconductor chip 113 including the first marker, and output an image signal corresponding to the acquired image of the surface of the semiconductor chip 113 to the control unit 105. The control unit 105 may detect the position of the first marker provided on the surface of the semiconductor chip 113 based on the image signal transmitted from the imaging unit 119.

The control unit 105 may recognize the position of the semiconductor chip 113 based on the detected first marker, and carry out the position correction of the semiconductor chip 113 held by the pickup unit 103 with respect to the attaching surface of the supporting substrate 117 so that the semiconductor chip 113 is arranged at the mounting position of the attaching surface of the supporting substrate 117. In other words, the control unit 105 may rotate (rotation in horizontal plane) and move the nozzle 107 in the XYZ axes directions (front and back direction, left and right direction, and up and down direction) through the movement control unit 109 based on the first marker to carry out the position correction of the semiconductor chip 113. After carrying out the position correction of the semiconductor chip 113, the control unit 105 controls the pickup unit 103 so that the semiconductor chip 113 is arranged at the mounting position of the attaching surface, moves the nozzle 107 holding the semiconductor chip 113, arranges the semiconductor chip 113 on the attaching surface of the supporting substrate 117, and pressurizes and adheres the same.

The mounting precision of the semiconductor chip 113 on the supporting substrate 117 can be enhanced by using the first marker provided on the surface of the semiconductor chip 113 for the position correction of the semiconductor chip 113 with respect to the attaching surface of the supporting substrate 117.

Furthermore, the control unit 105 may recognize the position of the semiconductor chip 113 without detecting the first marker. For example, the imaging unit 119 may image a region including the end of the semiconductor chip 113, and output an image signal corresponding to the image of the region including the end of the semiconductor chip 113 to the control unit 105. In this case, the image imaged by the imaging unit 119 merely needs to include at least the end of the semiconductor chip 113, and the imaging unit 119 may image one part of the semiconductor chip 113 including the end or may image the entire semiconductor chip 113 including the end. The control unit 105 may binarize the image signal transmitted from the imaging unit 119 to detect the position of a corner of the semiconductor chip 113. When imaging the semiconductor chip 113, the imaging unit 119 may image from the upper surface side or may image from the back surface side of the semiconductor chip 113.

The control unit 105 may recognize the position of the semiconductor chip 113 based on the detected position of the corner of the semiconductor chip 113, and control the pickup unit 103 to carry out the position correction of the semiconductor chip 113 held by the nozzle 107 with respect to the attaching surface of the supporting substrate 117 so that the semiconductor chip 113 is arranged at the mounting position of the attaching surface of the supporting substrate 117. In other words, the control unit 105 may rotate (rotation in horizontal plane) and move the nozzle 107 in the XYZ axes directions (front and back direction, left and right direction, and up and down direction) through the movement control unit 109 based on the position of the corner of the semiconductor chip 113 to carry out the position correction of the semiconductor chip 113. After carrying out the position correction of the semiconductor chip 113, the control unit 105 controls the pickup unit 103 to move the nozzle 107 holding the semiconductor chip 113 through the movement control unit 109, and arranges the semiconductor chip 113 on the attaching surface, and pressurizes and adheres the same.

An optically readable second marker may be provided on the surface of the supporting substrate 117, which is the body to be mounted. In this case, the semiconductor manufacturing apparatus 100 may further include an arbitrary imaging unit (not shown) for imaging the second marker. The imaging unit is an optical equipment for imaging an image of a surface of the attaching surface of the supporting substrate 117, and for example, may be a CCD camera. The imaging unit outputs an image signal corresponding to the image of the surface of the supporting substrate 117 including the second marker to the control unit 105. The control unit 105 may detect the position of the second marker provided on the surface of the supporting substrate 117 based on the image signal transmitted from the imaging unit.

The control unit 105 may recognize the position of the semiconductor chip 113 by the first marker provided on the semiconductor chip 113 or the position of the corner of the semiconductor chip 113, and furthermore, carry out the position correction of the semiconductor chip 113 held by the pickup unit 103 with respect to the attaching surface of the supporting substrate 117 based on the second marker provided on the surface of the supporting substrate 117 such that the semiconductor chip 113 is arranged at the mounting position of the attaching surface of the supporting substrate 117. After carrying out the position correction of the semiconductor chip 113, the control unit 105 controls the pickup unit 103 to move the nozzle 107 holding the semiconductor chip 113, and arranges the semiconductor chip 113 on the attaching surface of the supporting substrate 117 and pressurizes and adheres the same.

The mounting precision of the semiconductor chip 113 on the supporting substrate 117 can be further enhanced by using the second marker provided on the supporting substrate 117 for the position correction of the semiconductor chip 113 with respect to the attaching surface of the supporting substrate 117.

When the position correction of the semiconductor chip 113 held by the pickup unit 103 with respect to the attaching surface of the supporting substrate 117 is carried out, and the position of the nozzle 107 of the pickup unit 103 is fixed, the suction control unit 123 sets the second vacuum generator 121 and the nozzle 107 to the disconnected state (OFF) state after a predetermined time based on a signal indicating the position of the pickup unit 103 output from the control unit 105. The vacuum chuck of the semiconductor chip 113 by the nozzle 107 is released, and the die attach of the semiconductor chip 113 to the supporting substrate 117 is completed by setting the second vacuum generator 121 and the nozzle 107 to the disconnected state.

When carrying out the die attach using the semiconductor manufacturing apparatus 100 according to the first embodiment of the present invention, the conventional step of stripping the semiconductor chip 113 from the adhesive layer or the adhesive sheet is not required when picking up the semiconductor chip 113 from the semiconductor wafer 111. As described above, in the semiconductor manufacturing apparatus 100 according to the first embodiment of the present invention, the semiconductor wafer 111 is arranged on the stage 101 connected to the first vacuum generator 115, and the first vacuum generator 115 and the stage 101 are set to the disconnected state (OFF state) when the nozzle 107 picks up a predetermined semiconductor chip 113, so that the nozzle 107 can easily suction the predetermined semiconductor chip 113. Thus, the time required to pick up the predetermined semiconductor chip 113 from the semiconductor wafer 111 can be reduced, and the time required for the entire die attach step can be reduced.

A flow of a semiconductor manufacturing method according to one embodiment of the present invention will be described with reference to FIGS. 1 and 3. FIG. 3 is a flowchart describing a manufacturing method of a semiconductor device using the semiconductor manufacturing apparatus 100 according to the first embodiment of the present invention.

First, the semiconductor wafer 111 including the plurality of semiconductor chips 113 is arranged on the stage 101 of the semiconductor manufacturing apparatus 100 (S101). When the semiconductor wafer 111 is arranged on the stage 101, the stage 101 and the first vacuum generator 115 are in the connected state (ON state), and the stage 101 suctions and holds the semiconductor wafer 111.

After the semiconductor wafer 111 is suctioned and held on the stage 101, the protective film attached to the surface of the semiconductor wafer 111 is stripped (S102).

After the protective film is stripped, a predetermined semiconductor chip 113 is picked up from the semiconductor wafer 111 by the pickup unit 103 (S103). The movement of the pickup unit 103 is controlled by the control unit 105. The movement control unit 109 is moved/rotated based on the first control signal output from the control unit 105. The movement control unit 109 controls the movement of the nozzle 107 in the XYZ axes directions and the rotation of the nozzle 107 based on the second control signal output from the control unit 105. The nozzle 107 suctions and holds the predetermined semiconductor chip 113. When the nozzle 107 suctions and holds the predetermined semiconductor chip 113, the nozzle 107 and the second vacuum generator 121 are in the connected state (ON state), and the stage 101 and the first vacuum generator 115 are entirely or partially in the disconnected state (OFF state).

When the nozzle 107 picks up the predetermined semiconductor chip 113, the pickup unit 103 moves the semiconductor chip 113 from the stage 101 to the mounting position of the supporting substrate 117. In this case, the pickup unit 103 carries out the position correction of the semiconductor chip 113 with respect to the attaching surface of the supporting substrate 117 so that the semiconductor chip 113 is arranged at the mounting position of the attaching surface of the supporting substrate 117 based on the second control signal from the control unit 105 (S104).

After the position correction of the semiconductor chip 113 is carried out, the pickup unit 103 arranges and adheres the semiconductor chip 113 at the mounting position of the supporting substrate 117 (S105). When arranging and adhering the semiconductor chip 113 at the mounting position of the supporting substrate 117, nozzle 107 and the second vacuum generator 121 are in the disconnected state (OFF state).

After adhering the predetermined semiconductor chip 113 at the mounting position of the supporting substrate 117, the control unit 105 checks whether the pickup of all the semiconductor chips 113 in the semiconductor wafer 111 is completed (S106). In this case, the control unit 105 may check whether the pickup of all the semiconductor chips 113 is completed based on the image imaged by the imaging unit 119. If the pickup of all the semiconductor chips 113 is not completed, the semiconductor manufacturing apparatus 100 repeats the steps of S101 to S106. If the pickup of all the semiconductor chips 113 is completed, the step of die attach is completed.

Second Embodiment

A semiconductor manufacturing apparatus and a semiconductor manufacturing method according to a second embodiment of the present invention will be described with reference to FIGS. 4 to 8.

FIG. 4 is a block diagram showing a semiconductor manufacturing apparatus 200 according to the second embodiment of the present invention. In the semiconductor manufacturing apparatus 200 shown in FIG. 4, same reference numerals as the configuration of the semiconductor device 100 shown in FIG. 1 are denoted for the configuration same as or similar to the configuration in the semiconductor device 100 according to the first embodiment of the present invention shown in FIG. 1, and redundant description will be omitted or simplified.

With reference to FIG. 4, the semiconductor manufacturing apparatus 200 according to the second embodiment of the present invention includes the stage 101, a pickup unit 203, the control unit 105, and the suction control unit 123. The configuration excluding the pickup unit 203 in the semiconductor manufacturing apparatus 200 is the same as or similar to the configuration of the semiconductor manufacturing apparatus 100 according to the first embodiment of the present invention. Thus, the detailed description on the configuration other than the pickup unit 203 in the semiconductor manufacturing apparatus 200 will be omitted.

The pickup unit 203 includes a plurality of nozzles 207, and a movement control unit 209 connected to the plurality of nozzles 207 to move and rotate each nozzle 207. The movement control unit 209 is connected to the control unit 105.

The movement control unit 209 is controlled by the control unit 105, and is moved based on a first control signal output from the control unit 105. The movement control unit 209 may rotate based on the first control signal. The movement control unit 209 also rotates and moves each nozzle 207 in XYZ axes directions (front and back direction, left and right direction, and up and down direction). The movement control unit 209 controls the rotation and the movement of each nozzle 207 in the XYZ axes directions based on a second control signal output from the control unit 105.

Each of the plurality of nozzles 207 includes a hollow portion (not shown) connected to the second vacuum generator 121 via the second connecting portion 127. When the second vacuum generator 121 and the nozzle 207 are connected via the second connecting portion 127 (when the connection is in the ON state), the nozzle 207 vacuum chucks and holds the semiconductor chip 113 through the hollow portion. The connection of the second vacuum generator 121 and the nozzle 207 is controlled by the suction control unit 123. A contacting portion of each nozzle 207 that makes contact with the semiconductor chip 113 may be formed with a low elasticity material. For example, the contacting portion of each nozzle 207 that makes contact with the semiconductor chip 113 is preferably made from a material having a rubber hardness of about 40 to 80, and may be made from NBR, fluorine containing rubber, and the like. In FIG. 4, four nozzles 207 are shown, but the number of nozzles 207 is not limited thereto, and merely needs to be two or more.

The control unit 105 controls the movement and the rotation of the pickup unit 203. In other words, the control unit 105 outputs the first control signal to the movement control unit 209 to control the movement or the rotation of the movement control unit 209. Furthermore, the control unit 105 outputs the second control signal to the movement control unit 209 to control the rotation and the movement of the plurality of nozzles 207 in the XYZ axes directions (front and back direction, left and right direction, and up and down direction) through the movement control unit 209. The control unit 105 moves the pickup unit 203 to above the semiconductor wafer 111 held on the stage 101, and controls the movement and the rotation of the nozzle 207 such that each nozzle 207 picks up and holds a predetermined semiconductor chip 113 through the movement control unit 209.

Figure 5A:
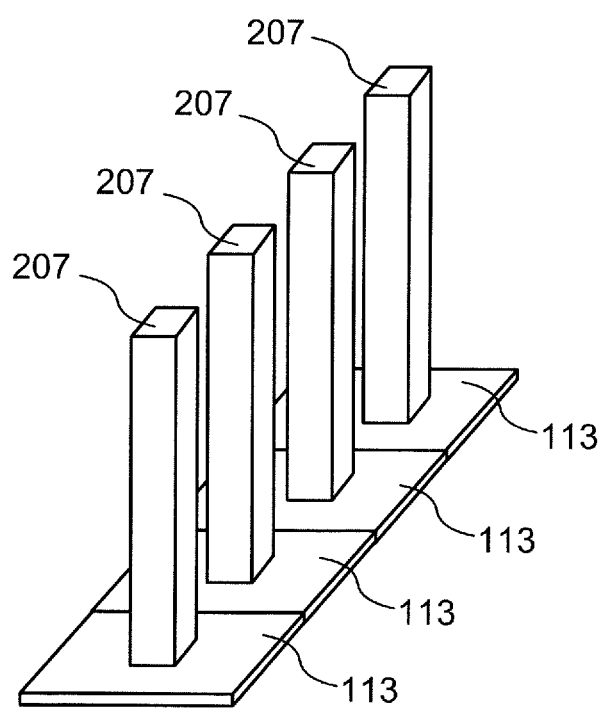
FIG. 5A is a view showing a step of picking up semiconductor chips and converting an interval of the semiconductor chips to a predetermined pitch.
Figure 5B:
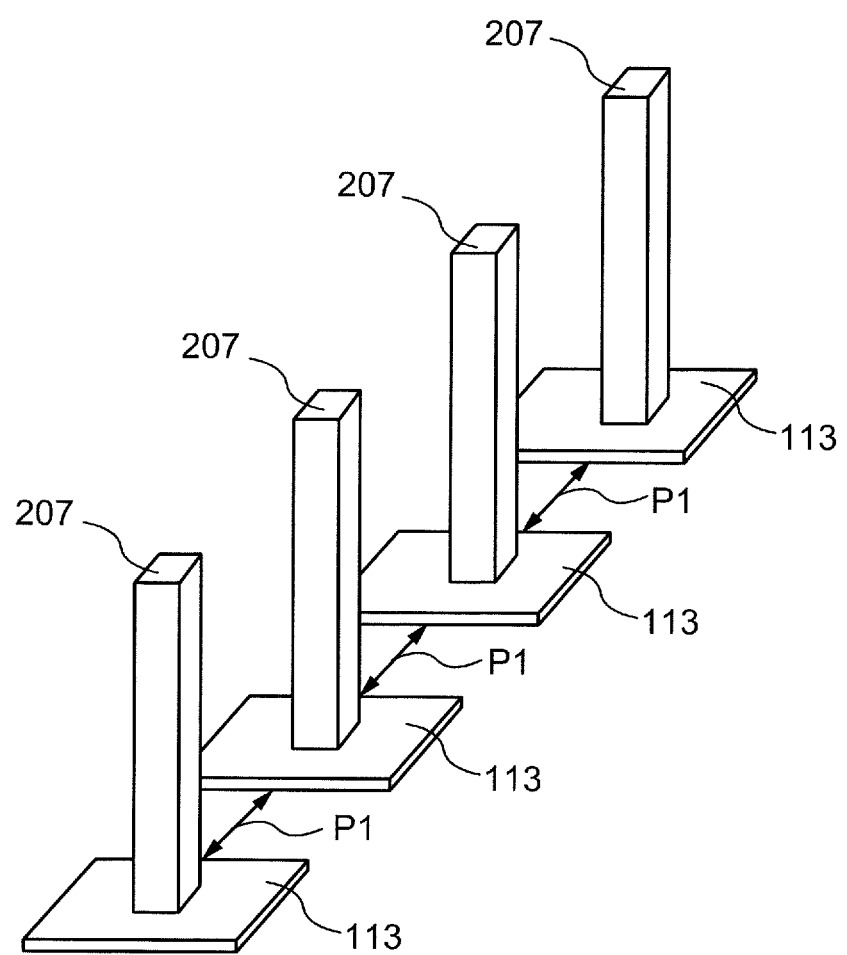
FIG. 5B is a view showing a step of picking up semiconductor chips and converting the interval of the semiconductor chips to the predetermined pitch.

As shown in FIG. 5A, the pickup unit 203 simultaneously picks up a plurality of semiconductor chips 113 from the semiconductor wafer 111 held on the stage 101. In other words, each of the plurality of nozzles 207 simultaneously vacuum chucks and holds the semiconductor chip 113. In this case, the suction control unit 123 sets the second vacuum generator 121 and each nozzle 207 to the connected state (ON state) through the second connecting portion 127, and sets the first vacuum generator 115 and the stage 101 to the disconnected state (OFF state). When the plurality of semiconductor chips 113 are held by the plurality of nozzles 207, the pickup unit 203 converts the interval of the plurality of semiconductor chips 113 held by each nozzle 207 to a predetermined pitch P1, as shown in FIG. 5B. In other words, the movement control unit 209 of the pickup unit 203 moves each nozzle 207 so that the interval of the semiconductor chips 113 adjacent to each other of the plurality of semiconductor chips 113 becomes the predetermined pitch P1 and holds the plurality of semiconductor chips while maintaining the pitch P1. The predetermined pitch P1 may be determined according to the size of the semiconductor chip 113.

When the pickup unit 203 suctions and holds the plurality of semiconductor chips 113, the control unit 105 moves the pickup unit 203 to above the wafer 111 held on the stage 101. The control unit 105 controls the movement of the plurality of nozzles 207 through the movement control unit 209 so that the plurality of nozzles 207 respectively picks up and holds the semiconductor chip 113 at the same time, the interval of the held plurality of semiconductor chips 113 becomes the predetermined pitch P1. The control unit 105 may recognize the position of the stage 101 by the imaging unit (CCD camera etc.) (not shown), align pickup unit 203 at the position of the semiconductor chip wafer 111, simultaneously suction and hold the plurality of individualized semiconductor chips 113 with the plurality of nozzles 207, and control the movement of the nozzle 207 so that the interval of the held plurality of semiconductor chips 113 becomes the predetermined pitch P1.

After converting the interval of the semiconductor chips 113 adjacent to each other to the predetermined pitch P1, the pickup unit 203 moves the plurality of semiconductor chips 113 from the stage 101 to the mounting positions of each semiconductor chip 113 in the attaching surface of the supporting substrate 117. The pickup unit 203 carries out the position correction of each semiconductor chip 113 with respect to the attaching surface of the supporting substrate 117 so that each of the plurality of semiconductor chips 113 is arranged at the mounting position of the attaching surface of the supporting substrate 117 based on the second control signal from the control unit 105 in a process in which the pickup unit 203 moves from above the stage 101 to the mounting position on the support substrate 117.

Figure 6:
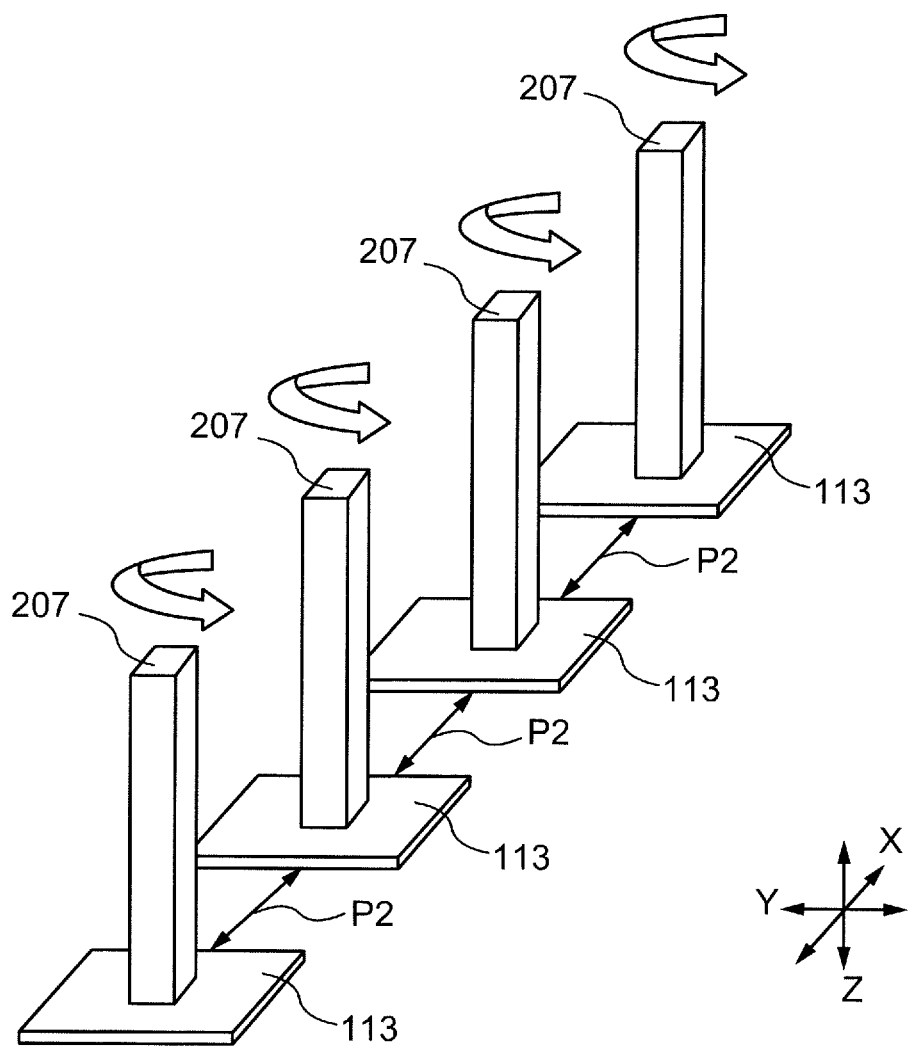
FIG. 6 is a view showing a step of carrying out position correction of the semiconductor chips spaced apart by the predetermined pitch.

In this case, as shown in FIG. 6, the control unit 105 carries out the position correction of the semiconductor chips 113 held by the pickup unit 203 with respect to the attaching surface of the supporting substrate 117 so that each semiconductor chip 113 is arranged at the respective mounting position of the attaching surface of the supporting substrate 117. In other words, the control unit 105 moves each of the plurality of nozzles 207 in the XYZ axes directions (front and back direction, left and right direction, and up and down direction) through the movement control unit 209 to carry out the position correction of each semiconductor chip 113. In FIG. 6, a state in which the control unit 105 moves each of the nozzles 207 in the X axis direction and the Y axis direction (front and back direction, and left and right direction) to carry out the position correction of the semiconductor chip 113, and corrects the interval of the plurality of semiconductor chips 113 held by the plurality of nozzles 207 from the pitch P1 to a pitch P2 (P1≠P2) is shown. As shown with an arrow in FIG. 6, the control unit 105 may rotate each nozzle 107 in the horizontal plane.

When the first marker is provided on the semiconductor chip 113, the control unit 105 may recognize the position of each semiconductor chip 113 based on the first marker, and carry out the position correction of each semiconductor chip 113 held by the pickup unit 203 with respect to the attaching surface of the supporting substrate 117 so that each semiconductor chip 113 is mounted at the respective mounting position of the attaching surface of the supporting substrate 117. Furthermore, the control unit 105 may recognize the position of each semiconductor chip 113 based on the position of the corner of each semiconductor chip 113, and carry out the position correction of each semiconductor chip 113 held by the pickup unit 203 with respect to the attaching surface of the supporting substrate 117 so that each semiconductor chip 113 is arranged at the mounting position of the attaching surface of the supporting substrate 117. Moreover, when the second marker is provided on the supporting substrate 117, the control unit 105 may carry out the position correction of each semiconductor chip 113 held by the pickup unit 203 with respect to the attaching surface of the supporting substrate 117 based on the second marker so that each semiconductor chip 113 is arranged at the mounting position of the attaching surface of the supporting substrate 117.

Figure 7:
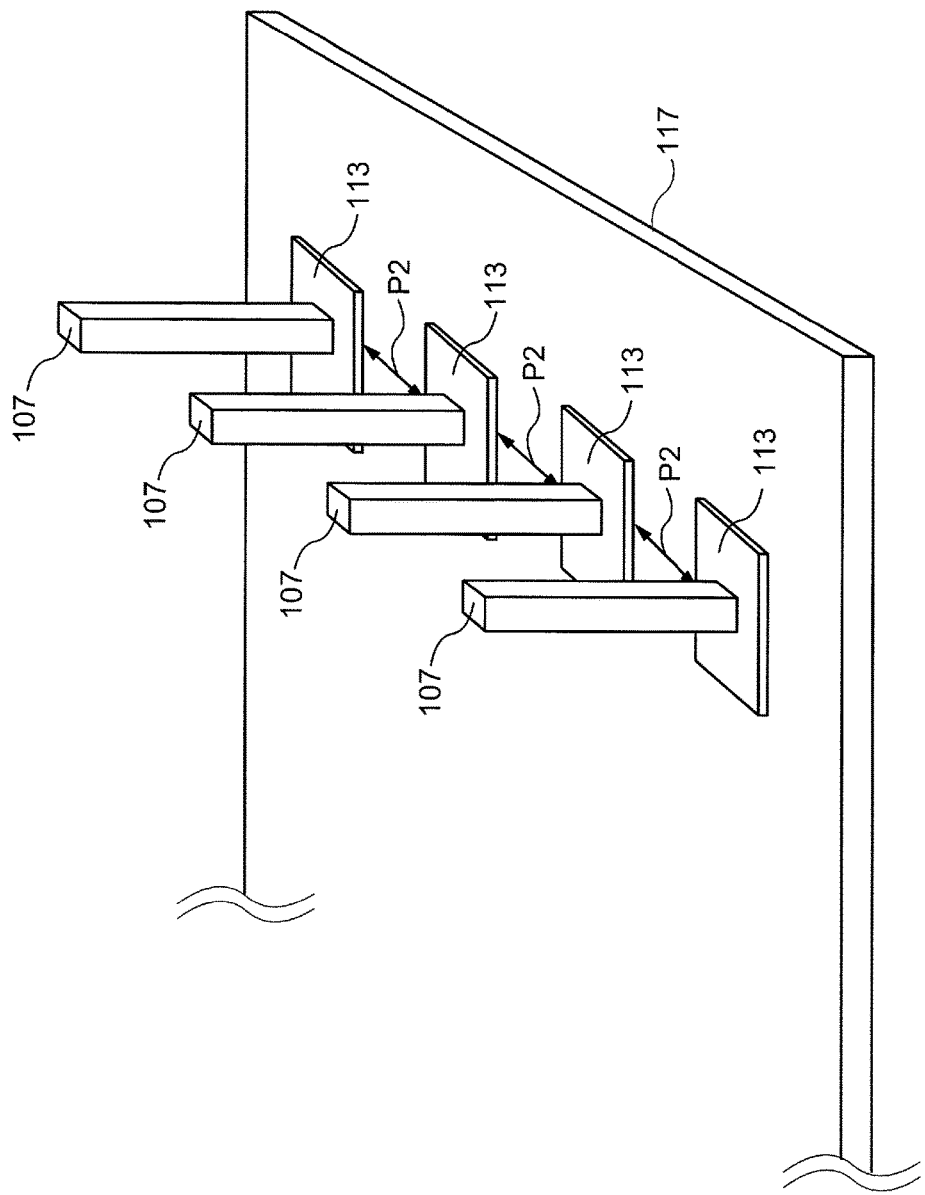
FIG. 7 is a view showing a step of adhering the semiconductor chip on the supporting substrate.

After the position correction of each semiconductor chip 113 with respect to the attaching surface of the supporting substrate 117 is carried out, the pickup unit 203 simultaneously arranges and adheres the plurality of semiconductor chips 113 at the mounting positions of the supporting substrate 117. In other words, the control unit 105 controls the pickup unit 203 to move each nozzle 207 holding the semiconductor chip 113 through the movement control unit 209 so that the plurality of semiconductor chips 113 are simultaneously arranged at the mounting positions of the attaching surface, simultaneously arranges the semiconductor chips 113 above the attaching surface of the supporting substrate 117, and pressurizes and adheres the same. In this case, the control unit 105 moves the pickup unit 203 so that each of the plurality of semiconductor chips 113 is arranged at the mounting positions of the attaching surface of the supporting substrate 117, and simultaneously pressurizes and adheres the plurality of semiconductor chips 113 on the attaching surface, as shown in FIG. 7. Thereafter, the control unit 105 releases the vacuum chuck of the plurality of semiconductor chips 113 by each nozzle 207 of the pickup unit 203 through the suction control unit 123. The die attach to the supporting substrate 117 of the plurality of semiconductor chips 113 is thereby completed.

When carrying out the die attach using the semiconductor manufacturing apparatus 200 according to the second embodiment of the present invention, the conventional step of stripping the semiconductor chip 113 from the adhesive layer or the adhesive sheet is not required when picking up the semiconductor chip 113 from the semiconductor wafer 111. Similar to the semiconductor manufacturing apparatus 100 according to the first embodiment of the present invention, in the semiconductor manufacturing apparatus 200, the semiconductor wafer 111 is arranged on the stage 101 connected to the first vacuum generator 115, where the first vacuum generator 115 and the stage 101 are in the disconnected state (OFF state) when the nozzle 207 picks up the semiconductor chip 113 so that the nozzle 207 can easily suction a predetermined semiconductor chip 113. Thus, the time required to pick up the semiconductor chip 113 from the semiconductor wafer 111 can be reduced, and the time required for the entire die attach step can be reduced.

According to the semiconductor manufacturing apparatus 200 of the second embodiment of the present invention, the plurality of semiconductor chips 113 can be simultaneously picked up, and the picked up plurality of semiconductor chips 113 can be simultaneously adhered on the supporting substrate 117. Thus, the time required for the die attach can be further reduced while maintaining the semiconductor chip mounting precision with respect to the attaching surface of the body to be mounted.

Furthermore, according to the semiconductor manufacturing apparatus 200 of the second embodiment of the present invention, after the plurality of semiconductor chips 113 are simultaneously picked up, the interval of the semiconductor chips 113 is converted to the predetermined pitch P1 while holding the semiconductor chips 113, and the position correction with respect to the attaching surface of the supporting substrate 117 is further carried out. Thus, the position correction does not need to be carried out with the picked up semiconductor chip 113 arranged on an intermediate stage, and the like, whereby the time required for the die attach can be further reduced.

Figure 8:
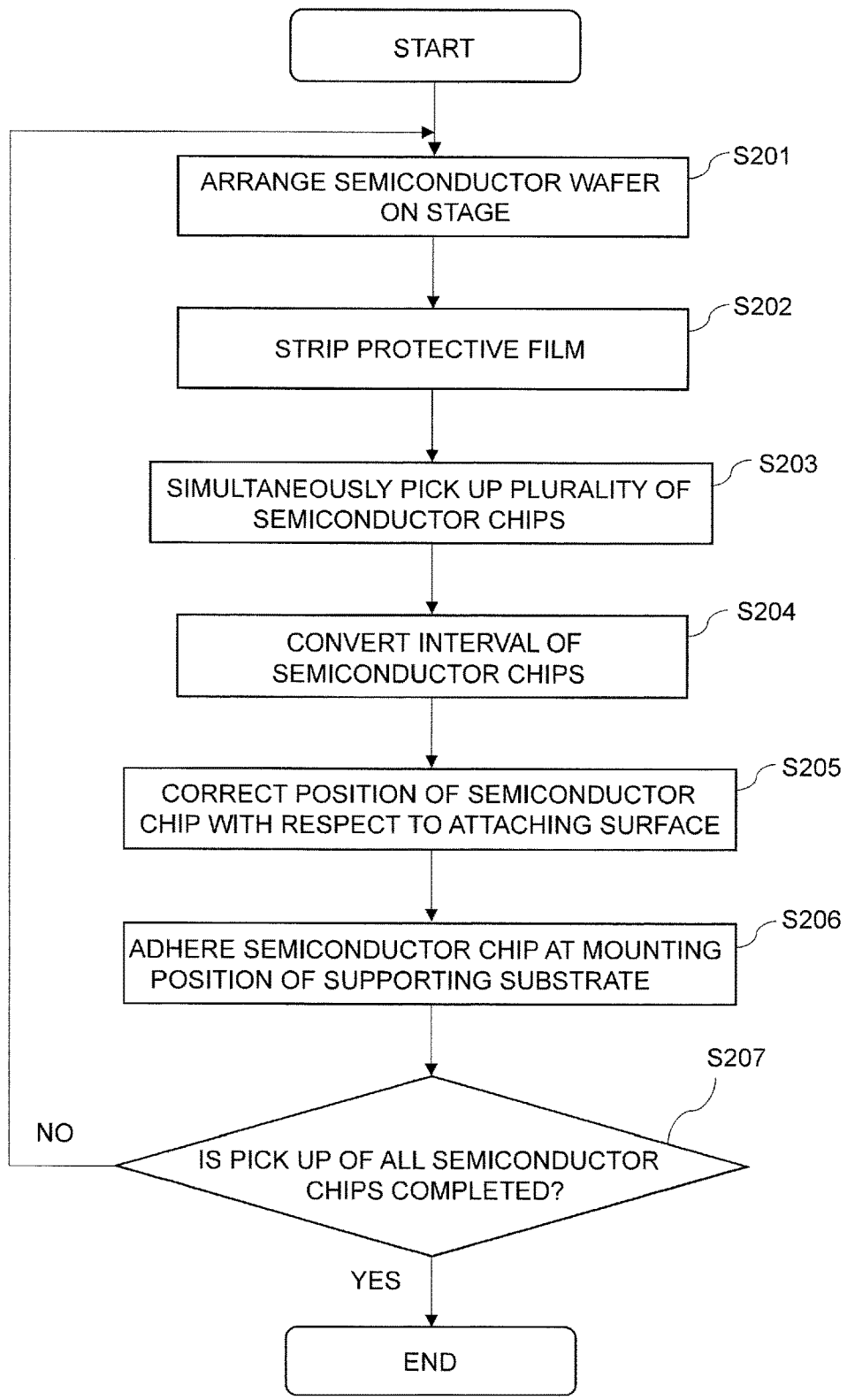
FIG. 8 is a flowchart describing a manufacturing method of a semiconductor device using the semiconductor manufacturing apparatus according to the second embodiment of the present invention.

With reference to FIGS. 4 and 8, the flow of the semiconductor manufacturing method according to one embodiment of the present invention will be described. FIG. 8 is a flowchart describing the semiconductor manufacturing method using the semiconductor manufacturing apparatus 200 according to the second embodiment of the present invention.

First, the semiconductor wafer 111 including the plurality of semiconductor chips 113 are arranged on the stage 101 of the semiconductor manufacturing apparatus 200 (S201). When the semiconductor wafer 111 is arranged on the stage 101, the stage 101 and the first vacuum generator 115 are in the connected state (ON state), and the stage 101 suctions and holds the semiconductor wafer 111.

After suctioning and holding the semiconductor wafer 111 on the stage 101, the protective film attached to the surface of the semiconductor wafer 111 is stripped (S202).

After the protective film is stripped, a plurality of semiconductor chips 113 are picked up from the semiconductor wafer 111 by the pickup unit 203 (S203). The movement of the pickup unit 203 is controlled by the control unit 105. The movement control unit 209 is moved/rotated based on the first control signal output from the control unit 105. The movement control unit 209 controls the rotation and the movement in the XYZ axes directions of each nozzle 207 based on the second control signal output from the control unit 105. Each of the plurality of nozzles 207 suctions and holds the predetermined semiconductor chip 113. When each nozzle 207 suctions and holds the predetermined semiconductor chip 113, the nozzle 207 and the second vacuum generator 121 are in the connected state (ON state), and the stage 101 and the first vacuum generator 115 are entirely or partially in the disconnected state (OFF state).

When each nozzle 207 picks up the predetermined semiconductor chip 113, the pickup unit 203 converts the interval of the plurality of semiconductor chips 113 held by each nozzle 207 to the predetermined pitch P1 (S204).

Thereafter, the pickup unit 203 moves each semiconductor chip 113 held by each nozzle 207 from the stage 101 to the mounting position of the supporting substrate 117 by the control unit 105. In this case, the pickup unit 203 carries out the position correction of each semiconductor chip 113 with respect to the attaching surface of the supporting substrate 117 so that each semiconductor chip 113 is arranged at the mounting position of the attaching surface of the supporting substrate 117 based on the second control signal from the control unit 105 (S205).

After carrying out the position correction of each semiconductor chip 113, the pickup unit 203 simultaneously arranges and adheres the plurality of semiconductor chips 113 at the mounting positions of the supporting substrate 117 (S206). When arranging and adhering the semiconductor chips 113 at the mounting positions of the supporting substrate 117, each nozzle 207 and the second vacuum generator 121 are in the disconnected state (OFF state).

After adhering the plurality of semiconductor chips 113 at the mounting positions of the supporting substrate 117, the control unit 105 checks whether the pickup of all the semiconductor chips 113 in the semiconductor wafer 111 is completed (S207). In this case, the control unit 105 may check whether the pickup of all the semiconductor chips 113 is completed based on the image imaged by the imaging unit 119. If the pickup of all the semiconductor chips 113 is not completed, the semiconductor manufacturing apparatus 200 repeats the steps of S201 to S207. If the pickup of all the semiconductor chips 113 is completed, the step of die attach is completed.

As described above, according to the semiconductor manufacturing apparatus of one embodiment of the present invention, the time required for the die attach step in the semiconductor manufacturing method can be reduced.

The invention claimed is:

1. A semiconductor manufacturing apparatus comprising:
   a stage connected to a vacuum generator to suction a semiconductor wafer including a plurality of semiconductor chips;
   a suction control unit connected to a connecting portion of the stage and the vacuum generator to control the connection of the stage and the vacuum generator;
   a pickup unit simultaneously picking up the plurality of semiconductor chips, the pickup unit being connected to a movement control unit; and
   a control unit controlling movement and rotation of the pickup unit and controlling the suction control unit, the control unit being connected to the movement control unit; wherein:
   the pickup unit converts an interval of the plurality of semiconductor chips to a predetermined pitch and holds the pitch; and
   the pickup unit moves the plurality of semiconductor chips from the stage to mounting positions of a supporting substrate and simultaneously adheres the plurality of semiconductor chips at the mounting positions by the control unit.

2. The semiconductor manufacturing apparatus according to claim 1, wherein:
   the pickup unit includes a plurality of nozzles for holding the plurality of semiconductor chips, respectively; and
   the control unit controls movement and rotation of each of the plurality of nozzles.

3. The semiconductor manufacturing apparatus according to claim 2, further comprising an imaging unit connected to the control unit and configured to image a marker provided in an optically readable manner on each of the plurality of semiconductor chips; wherein:
   the control unit recognizes a position of the marker based on an image of the marker imaged by the imaging unit, and controls the movement and the rotation of the plurality of nozzles.

4. The semiconductor manufacturing apparatus according to claim 2, further comprising
   an imaging unit that images a region including an end of the semiconductor chip; wherein
   the control unit recognizes a position of a corner of the semiconductor chip based on an image including the end of the semiconductor chip imaged by the imaging unit, and controls the movement and the rotation of the plurality of nozzles.

5. The semiconductor manufacturing apparatus according to claim 4, wherein the imaging unit images the region including the end of the semiconductor chip from an upper surface side or a back surface side of the semiconductor chip.

6. The semiconductor manufacturing apparatus according to claim 4, wherein the control unit binarizes the image of the region including the end of the semiconductor chip to recognize the position of the corner of the semiconductor chip.

7. The semiconductor manufacturing apparatus according to claim 1, further comprising a stripping unit that strips a protective film attached to a surface on an opposite side of the surface facing the stage of the semiconductor wafer.

\* \* \* \* \*